US006583069B1

(12) United States Patent
Vassiliev et al.

(10) Patent No.: US 6,583,069 B1

(45) Date of Patent: *Jun. 24, 2003

(54) METHOD OF SILICON OXIDE AND SILICON GLASS FILMS DEPOSITION

(75) Inventors: Vladislav Y. Vassiliev, Singapore (SG); John Leonard Sudijono, Singapore (SG)

(73) Assignee: Chartered Semiconductor Manufacturing Co., Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 09/458,729

(22) Filed: Dec. 13, 1999

(51) Int. Cl.[7] .............................................. H01L 21/316

(52) U.S. Cl. ....................... 438/778; 438/783; 438/784; 438/789

(58) Field of Search ................................ 438/778, 784, 438/787, 788, 789, 790

(56) References Cited

U.S. PATENT DOCUMENTS

| | | | | | |
|---|---|---|---|---|---|
| 5,728,621 | A | | 3/1998 | Zheng et al. | 438/427 |
| 5,814,564 | A | | 9/1998 | Yao et al. | 438/723 |
| 5,827,785 | A | | 10/1998 | Bhan et al. | 438/784 |
| 5,908,672 | A | | 6/1999 | Ryu et al. | 427/574 |
| 5,915,190 | A | | 6/1999 | Pirkle | 438/424 |
| 5,946,592 | A | | 8/1999 | Lin | 438/633 |
| 5,976,993 | A | * | 11/1999 | Ravi et al. | 438/788 |
| 6,030,881 | A | * | 2/2000 | Papasouliotis et al. | 438/424 |
| 6,355,581 | B1 | * | 3/2002 | Vassiliev et al. | 438/789 |

OTHER PUBLICATIONS

S. Wolf et al., Silicon Processing for the VLSI Era, vol. 1, Process Technology. Lattice Press, 1986, pp. 546 and 581.*

L. Baud et al., Integration of a Stack of Two Fluorine Doped Silicone Oxide Thin Film with Interconnect Metallization for Sub–0.35 Micron Inter–Metal Dielectric Applications. Materials for Advanced Metallization (MAM) 1997, pp. 64–67.*

C. S. Pai et al., A Manufacturable Embedded Fluorinated SiO2 for Advanced 0.25 Micron CMOS VLSI Multilevel Interconnect Application. IEEE 1998, pp. 39–41.*

(List continued on next page.)

*Primary Examiner*—Wael Fahmy
*Assistant Examiner*—Anh Duy Mai
(74) *Attorney, Agent, or Firm*—George O. Saile; Rosemary L. S. Pike

(57) ABSTRACT

A method for fabricating a silicon oxide and silicon glass layers at low temperature using High Density Plasma CVD with silane or organic or inorganic silane derivatives as a source of silicon, inorganic compounds containing boron, phosphorus, and fluorine as doping compounds, oxygen, and gas additives is described. RF plasma with certain plasma density is maintained throughout the entire deposition step in a reactor chamber. A key feature of the invention's process is a mole ratio of gas additive to source of silicon, which is maintained in the range of about 0.3–20 depending on the compound used and the deposition process conditions. As a gas additive, one of the group including halide-containing organic compounds having the general formula $C_xH_yR_z$, and chemical compounds with the double carbon-carbon bonds having the general formula $C_nH_{2n}$, is used. This feature provides the reaction conditions for the proper reaction performance that allows a deposition of a film with good film integrity and void-free gap-fill between the steps of device structures.

19 Claims, 5 Drawing Sheets

OTHER PUBLICATIONS

S. Hsieh et al., Optimization for Low–K Dielectric (Fluorinated SiO2) Process and Evaluation of Yield Impact by Using BEOL Test Structures. IEEE 2000, pp. 205–209.*

V. Vassiliev et al., "Properties and Gap–Fill Capability of HDP–PSG Films for 0.18 μm Device Applications and Beyond", Proceedings of Fifth Dielectrics for ULSI Multilevel Int. Conf. (DMIC), (1999), pp. 235–244.

R. Conti et al., "Processing Methods to Fill High Aspect Ratio Gaps Without Premature Constriction", Proceedings of Fifth Dielectrics for ULSI Mutlilevel Int. Conf. (DUMIC), (1999), pp. 201–209.

J. Yota, "Extendibility of ICP High–Density Plasma CVD for Use as Intermetal Dielectric and Passivation Layers for 0.18 μm Technology", Proceedings of Fifth Dielectrics for ULSI Multilevel Int. Conf. (DUMIC), (1999), pp. 71–82.

* cited by examiner

METHOD OF SILICON OXIDE AND SILICON GLASS FILMS DEPOSITION

BACKGROUND OF THE INVENTION

1. Field of the Invention

This invention relates generally to fabrication of semiconductor devices and more particularly to the fabrication of silicon oxide and silicon glass films by using a High Density Plasma Chemical Vapor Deposition (HDP-CVD) technique with gas mixtures containing silane or its derivatives, necessary doping precursors, oxygen, and special gas additives.

2. Description of the Prior Art

In the fabrication of devices such as semiconductor devices, a variety of material layers are sequentially formed and processed on the substrate. For the purpose of this disclosure, the substrate includes a bulk material such as semiconductor, e.g., silicon, body, and if present, various regions of materials such as dielectric materials, conducting materials, metallic materials, and/or semiconductor materials. One of the material regions utilized in this fabrication procedure includes a silicon oxide, i.e., a material represented by the formula $SiO_n$, where n=~2, or doped silicon oxide films, containing an additional doping element such as boron, phosphorus, fluorine, carbon, and their mixtures with total dopant content depending on the purpose of film application in the device. Below, the common term "silicon oxide film" is used to characterize both silicon dioxide films and silicon oxide based glass films. Silicon oxide regions are utilized as insulating/passivating layers; as an electrical insulation between conducting layers, e.g., polysilicon or metal layers. Films of undoped silicon oxide are used also as a liner or as a cap layer either under or on the doped silicon oxide layers, respectively, to limit unacceptable dopant migration during subsequent processing.

Among other techniques used in semiconductor processing, silicon oxide films are deposited using Plasma Enhanced Chemical Vapor Deposition (PECVD), and High Density Plasma Chemical Vapor Deposition (HDP-CVD) techniques. The last technique assumes simultaneous deposition and sputtering of depositing films in order to improve gap-fill capability, as shown schematically in FIG. 1. FIG. 1 shows steps 102 formed on a semiconductor substrate 101. The silicon oxide film 103 is deposited over the steps 102. $SiO_2$ species are shown 104 on the surface of the film. Ionized Ar molecules 105 bombard the surface of the film resulting in sputtered and redeposited $SiO_2$ 106 and vaporized $SiO_2$ species 107.

The method of chemical vapor deposition of silicon oxide and doped silicon glass films at High Density Plasma conditions (HDP-CVD) with silane-oxygen based gas mixtures is used in semiconductor manufacturing mostly for sub-quarter micron Ultra Large Scale Integrated (ULSI) circuit device applications. This method is used for deposition of silicon oxide, or frequently known as undoped silicon glass (USG), phosphosilicate glass (PSG), fluorosilicate glass (FSG). In the case of doped films, the dopant precursor, such as phosphine $PH_3$, for example, is added to the silane-oxygen mixture. Also, organic/inorganic silane derivatives, such as tetrafluorosilane $SiF_4$, or difluorosilane $SiH_2F_2$, are used either alone or in a mixture with silane.

The problem of film integrity and void formation (below, the common term "voids" is used for both types of film structure imperfection) in different types of as-deposited HDP-CVD films have been found and analyzed recently, see for instance: [Ref 1] R. Conti, L. Economikos, G. D. Parasouliotis, et al. *Proceedings of Fifth Dielectrics for ULSI Multilevel Int.Conf.* (DUMIC), (1999), p. 201 and [Ref 2] J. Yota, A. Joshi, C. Nguyen et al, *Proceedings of Fifth Dielectrics for ULSI Multilevel Int.Conf.* (DUMIC), (1999), p. 71.

The reason for void formation under HDP-CVD conditions is normally explained as a result of redeposition of the film on the nearest surfaces caused by etch/sputtering of the film with argon bombardment from the top edges of the structure steps, as shown in FIG. 1. This effect is shown in progress in FIG. 2. Continuous deposition with etch/sputtering causes the formation of film on the steps 102 (shown in FIG. 2A), followed by void formation 108 at the smallest spacings, as shown in FIG. 2B, followed by void formation at certain critical spacing ($G_{critical}$) and critical aspect ratios ($AR_{critical}$) 109. At the same time, a void-free film forms at a certain gap spacing, which is larger than critical, and aspect ratio, which is less than critical, as shown in FIG. 2B, 110, that eventually leads to the void-free gap fill when the full film thickness is achieved, as shown in FIG. 2C.

Detailed analysis of HDP-CVD gap fill capability for an example of structures with vertical side wall steps, mostly desired for ULSI applications, has been performed in [Ref 3] V. Vassiliev, C. Lin, D. Fung et al. *Proceedings of Fifth Dielectrics for ULSI Multilevel Int.Conf.* (DUMIC), (1999), p. 235, for the above mentioned film types and two main ranges of the HDP-CVD deposition temperature, namely, less than about 400° C. and higher than about 500° C. These summarized data are presented in FIG. 3. HDP-CVD gap fill capability is shown for rectangular step shape with vertical side walls at low temperature (<400° C.) (line 31), rectangular step shape with vertical side walls at high temperature (>500° C.) (line 33), and tapered gap space with rounded top step corners (line 35).

Thus, HDP-CVD gap-fill capability limitations for the commonly used deposition conditions can be quantitatively described by simple equations:

$$AR_{critical} \leq k x G_{critical},$$

where the values of coefficient k have been found to be about 13.3 $\mu m^{-1}$ and 20.1 $\mu m^{-1}$ for high and low temperature processes, respectively. To reduce void formation effects in HDP-CVD, e.g. to enhance gap-fill capability of the HDP-CVD technique, the following approaches have been considered recently:

a) a decrease of the etch (sputtering) component to deposition ratio (below "E/D ratio") and decrease of process pressure. This helps to reduce an impact of film sputtering and, therefore, redeposition. However, these measures cause an undesirable decrease of HDP-CVD process productivity as well as a necessity to enhance pump productivity.

b) Structure rounding, as described in [Ref.3] and as shown schematically in FIG. 4B. In fact, such rounding allows much better HDP-CVD gap-fill capability using the same process conditions, including pressure, power, etch to deposition ratio, as shown in FIG. 3. However, this approach is not applicable for all ULSI device structure elements.

Voids in device structures are not acceptable because of a worsening of device reliability. Therefore, it is very desirable to produce a good HDP-CVD film integrity and gap-fill capability. The prior art processes do not provide a silicon oxide layer that can satisfactorily fill gaps between the increasingly tight step features of new ULSI semiconductor devices without forming voids in between the conductor lines.

The importance of overcoming the various deficiencies noted above is evidenced by the extensive technological development directed to the subject, as documented by the relevant patent and technical literature. The closest and apparently more relevant technical developments in the patent literature can be gleaned by considering the following. U.S. Pat. No. 5,915,190 to Pirkle shows a PECVD thin protection layer and a high RF-power sputter/CVD technique. U.S. Pat. No. 5,814,564 to Yao et al teaches a HDP-CVD process followed by spin-on-glass (SOG) deposition and a 6-step etch process to planarize the two layers. U.S. Pat. No. 5,946,592 to Lin teaches forming 3 HDP-CVD layers then a CVD layer. U.S. Pat. No. 5,728,621 to Zheng et al teaches HDP-CVD, then SOG. U.S. Pat. No. 5,827,785 to Bhan et al and U.S. PAT. No. 5,908,672 to Ryu et al show FSG processes.

SUMMARY OF THE INVENTION

It is an object of the present invention to provide a method for fabricating silicon oxide layer that provides films with good film integrity without voids in the film within steps of device structures using a HDP-CVD deposition process with silane or silane derivatives and oxygen mixtures, and gas additives.

It is an object of the present invention to provide a method for fabricating a silicon oxide layer over a stepped substrate surface using "HDP-CVD with additives" process that produces good integrity of film along the device steps and void-free structures. The invention "HDP-CVD with additives" process and preferred Invention's process conditions are shown below in Table 1. The most critical parameters in the invention are additive to silicon source mole ratio, sputtering to deposition ratio, and total pressure.

The invention has the following advantages: good gap-fill capability at relatively high process pressures and etch to deposition ratios, relatively high deposition rate, and process productivity. Besides, it is simply realized and there is no need to change chamber design.

The present invention achieves these benefits in the context of known process technology. However, a further understanding of the nature and advantages of the present invention may be realized by the reference to the latter portions of the specification and the attached drawings.

TABLE 1

| Process parameter | Estimated range of parameters for Invention's HDP-CVD with additives | An example of preferred set of parameters |
|---|---|---|
| Wafer temperature (° C.) | 250–650 | 400–650 |
| Pressure (millitorr) | 0.5–10 | 1–5 |
| Plasma frequency (KHz) | 300–600 | 400–450 |
| Plasma density (ion/$cm^3$) | 1 × E11–1 × E13 | 1 × E11–1 × E12 |
| Etch to deposition ratio | 0.03–0.3 | 0.05–0.15 |
| Silicon source | Silane Inorganic silane derivatives Organic silane derivatives | Silane Methylsilanes |
| Silicon source flow (sccm) | 50–500 | 100–200 |
| Oxygen flow (sccm) | 100–400 | 250–350 |
| Dopant compounds | Diborane and its derivatives Phosphine and its derivatives Fluorinated silane derivatives | Diborane and its derivatives Phosphine and its derivatives Fluorinated silane derivatlves |

TABLE 1-continued

| Process parameter | Estimated range of parameters for Invention's HDP-CVD with additives | An example of preferred set of parameters |
|---|---|---|
| Dopant gas flows | Must be chosen based on desirable dopant concentration | Must be chosen based on desirable dopant concentration |
| Carrier gas | Ar, He | Ar, He |
| Carrier gas flow (sccm) | 20–400 | 50–100 |
| Gas additives | 1) halides-contained organic compound with general formula $C_xH_yR_z$*) 2) organic chemical compounds with the double carbon-carbon bonds with general formula $C_nH_{2n}$**) | 1) $CF_4$, $CHF_3$; $CCl_4$ or $C_2F_6$; 2) ethylene $C_2H_4$ or Propylene $C_3H_6$ |
| Additive/silicon source mole ratio: | | |
| organic halides compounds | 0.3–5 | 0.5–2.5 |
| organic $C_nH_{2n}$ compounds | 3–20 | 5–15 |

*)R is fluorine or chlorine. In these compounds, x can range from 1 to 4; y can range from 0 to 8; z can range from 8 to 0 in reverse order with respect to y. Most convenient compounds are fluorine/chlorine compounds such as $CF_4$, $CCl_4$, and $C_2F_6$, which are actively used in semiconductor manufacturing.
**)n can be from 1 to 4.

BRIEF DESCRIPTION OF THE DRAWINGS

The features and advantages of a semiconductor device according to the present invention and further details of a process of fabricating such as a semiconductor device in accordance with the present invention will be more clearly understood from the following description taken in conjunction with the accompanying drawings in which like reference numerals designate similar or corresponding elements, regions and in which.

DETAILED DESCRIPTION OF THE PREFERRED EMBODIMENTS

The present invention will be described in detail with reference to the accompanying drawings. In the following description, numerous specific details are set forth such as flow rates, pressure settings, thicknesses, etc., in order to provide a more thorough understanding of the present invention. It will be obvious, however, to one skilled in the art that the present invention may be practiced without these details. In other instances, well known processes have not been described in detail in order to not unnecessarily obscure the present invention. Also, the flow rates in the specification can be scaled up or down keeping the same molar % or ratios to accommodate different sized reactors as is known to those skilled in the art.

A. Observation of Voids in HDP-CVD Films

Figure 2A:
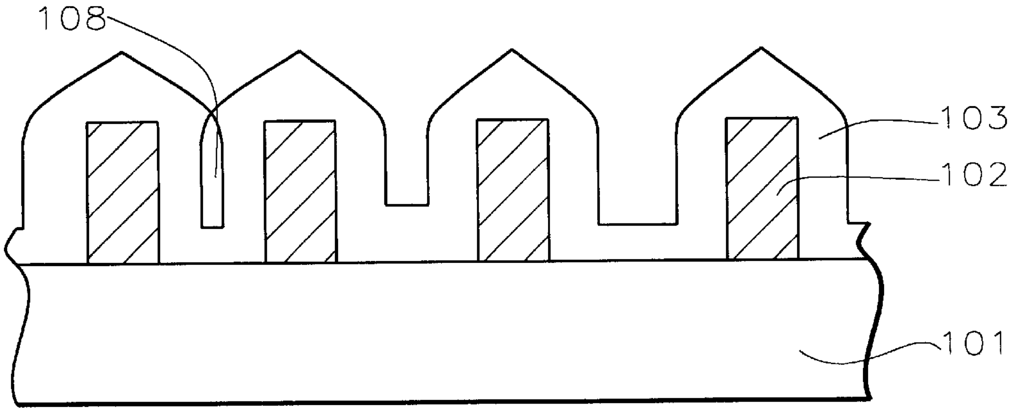
FIG. 2A Prior Art
FIGS. 2A, 2B and 2C are cross-sectional views illustrating a void formation process at HDP-CVD conditions.
Figure 2B:
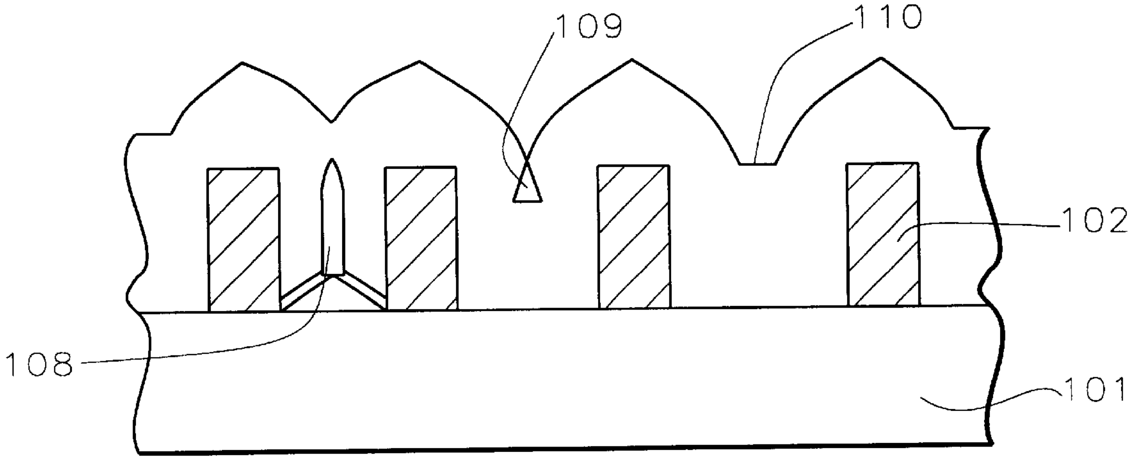
FIG. 2B Prior Art
Figure 2C:
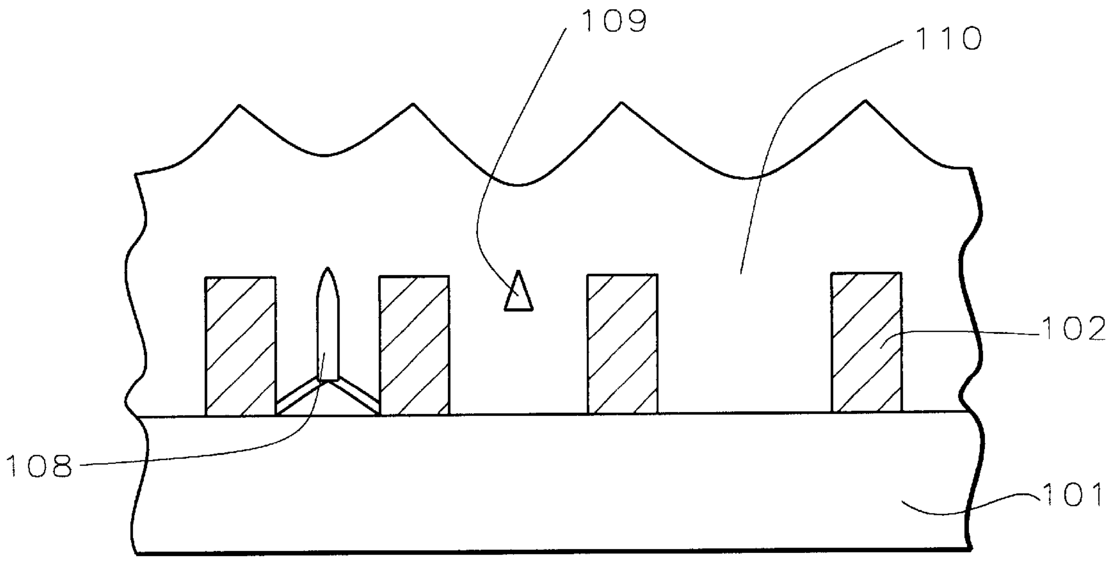
FIG. 2C Prior Art
Figure 3:
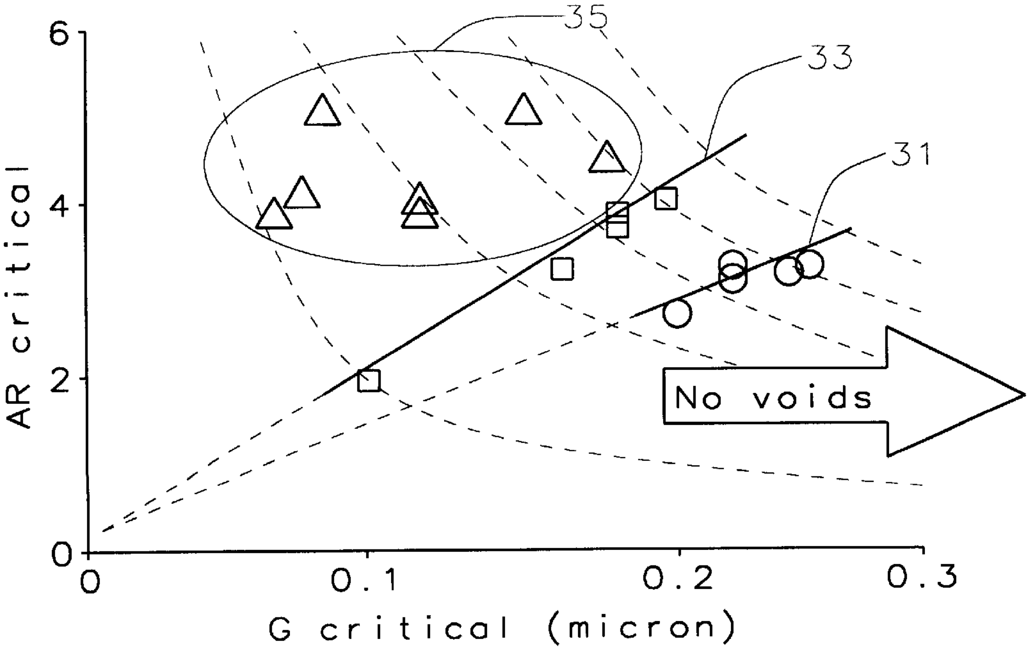
FIG. 3 Prior Art
FIG. 3 is a graph showing summarized HDP-CVD gap-fill capability for different deposition conditions and different types of dielectric films.
Figure 4A:
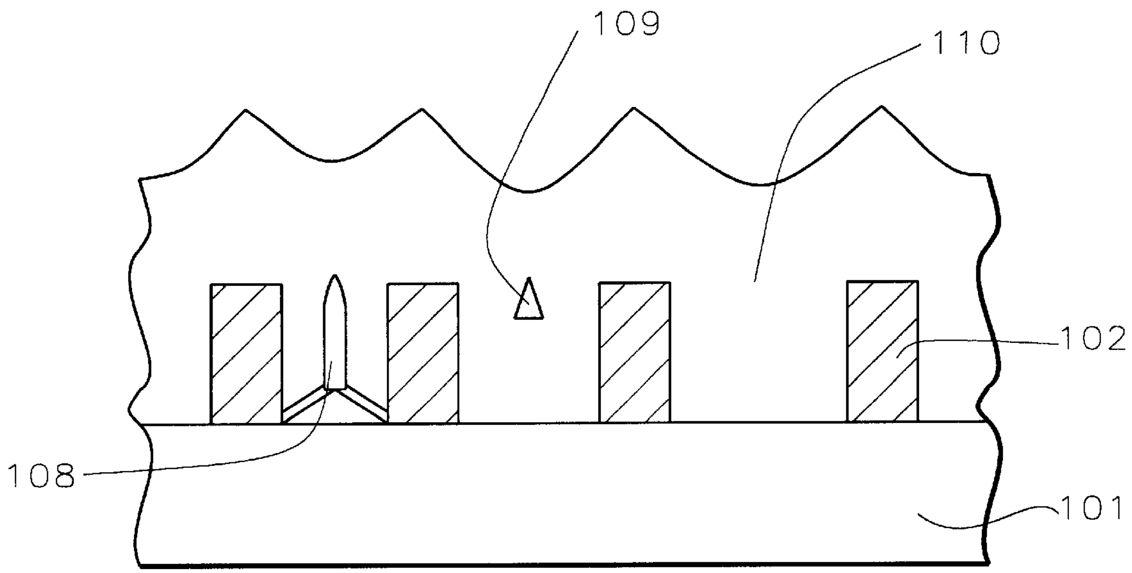
FIG. 4A Prior Art
FIGS. 4A and 4B are cross-sectional views of HDP-CVD film deposition for rectangular and tapered shape of device structures, respectively.
Figure 4B:
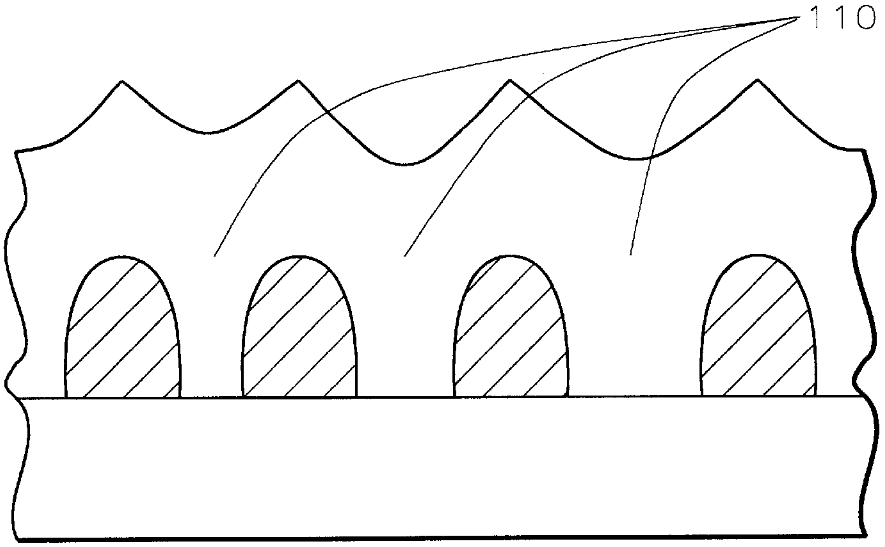
FIG. 4B Prior Art

Normally, voids can be observed using cross sectional scanning electron microscopy analysis of device structures. Film imperfection, or voids, in different types of HDP-CVD films have been found to form in the bottom corners of as-deposited films, and in the center of space between two nearest lines of a device, as shown in FIG. 2A–FIG. 2C. The shape of voids is dependent on the film type and gap geometry, namely space between lines (G) and aspect ratios (AR). Aspect ratio is a certain characteristic which defines structure and can be calculated by dividing the gap height by the gap space.

B. Problems of Conventional HDP-CVD Processes

The inventors have determined that previous silicon oxide deposition techniques do not meet the changing requirements of new denser products. It is to be understood in this regard that no portion of the discussion below is admitted to be prior art as to the present invention. Rather, this highly simplified discussion is an effort to provide an improved understanding of the problems that are overcome by the invention.

The general characteristics of a prior art approach are listed in the Table 2 below.

The following conclusions can be drawn from the comparison of data in Table 2: advantages of the prior art HDP-CVD process cannot be used because of bad film gap-fill capability. Advantages of this method, and more advantages of film gap-fill capability can be achieved using the invention's "HDP-CVD with additives" process.

TABLE 2

| HDP-CVD method | Advantage | Disadvantage |
|---|---|---|
| HDP-CVD prior art | 1. Good gap-fill capability at high spacing and small aspect ratios.<br>2. Relatively high deposition rate | 1. Gap-fill capability becomes worse with tightening of gap spacing and with the increase of aspect ratios. It needs process pressure and E/D ratio to be decreased.<br>2. Decrease the deposition rate and process productivity with the decrease of pressure and E/D ratio.<br>3. Non-acceptable voiding in device structures causes reliability issues |
| Invention: HDP-CVD additives process | 1. Good gap-fill capability at small spacing and high aspect ratio at relatively high deposition pressures and E/D ratios<br>2. Relatively high deposition rate and productivity<br>3. Simply realized | |

To clarify prior art HDP-CVD process features, an analysis of major deposition problems is presented below in detail using a silane $SiH_4$, mostly used for HDP-CVD processes at present, as a typical silicon source representative of the present invention.

It is known that the chemical reaction of silane with oxygen can be realized in a wide range of temperatures (from room temperatures and above) to produce silicon oxide as either a powder or a film. This reaction is known to have a chain reaction mechanism, as simply presented below in scheme (1), with a formation of highly active intermediate products (IMP)-radicals followed by formation a $SiO_2$ species in the gas phase. After that, gas-phase species diffuse to the surface followed by their adsorption and reaction to form a solid state film, as shown below:

$$\text{silane+oxygen} \rightarrow IMP_1 \rightarrow \ldots \rightarrow IMP_n \rightarrow SiO_2 \text{ (film)} \quad (1)$$

This reaction is considered as a gas phase limited reaction, e.g. the relatively slowest stage of chemical reaction is a formation of intermediate compounds IMP. It is also known that plasma excitation of reaction mixtures also causes a formation of highly active intermediate radicals, especially at conditions used in the High Density Plasma deposition method. Thus, HDP-CVD deposition with silane or silane derivatives and oxygen generally goes in accordance with radical mechanisms.

Figure 5A:
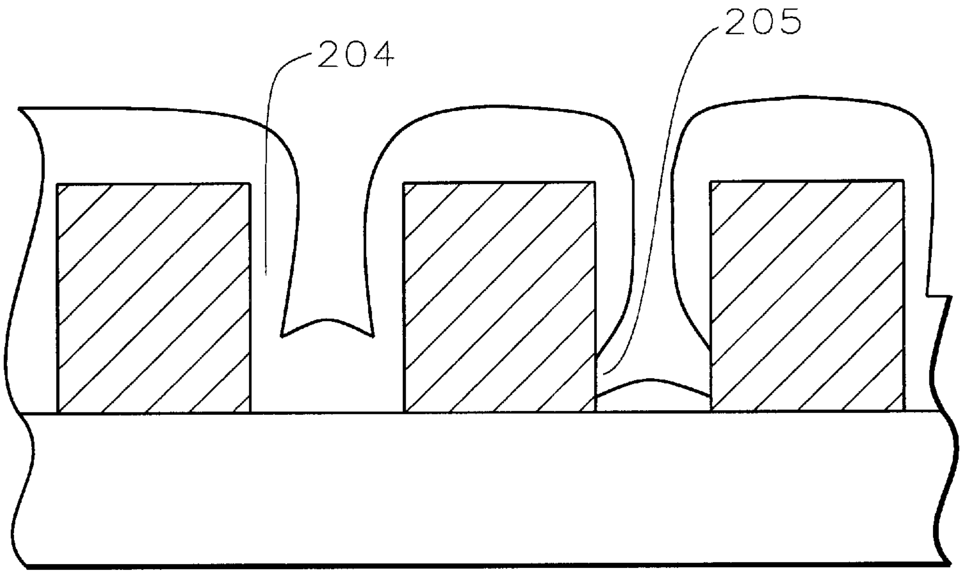
FIG. 5A Prior Art
FIGS. 5A and 5B are cross-sectional views of non-conformal step coverage at a conventional silane-oxygen CVD process and plasma-enhanced CVD process, respectively.

It is also known that a chemical vapor deposition technique with silane-oxygen mixtures usually provides very non-conformal step coverage of the deposited film on device steps 204, which leads to void formation or imperfection of film integrity in the bottom corners of device elements 205, as shown in FIG. 5A. This effect becomes dramatically stronger with a tightening of gap spacing between device elements and, therefore, with the increase of aspect ratios. This effect is also stronger with an increase of effective reaction constant ($K_{eff}$), e.g. deposition rate. (Effective reaction constant is determined as a ratio of the deposition rate value and a concentration of silicon compound in the gas phase. In fact, for the most studied CVD deposition reactions, a reaction rate has a first order with respect to the silicon precursors. In the case of a more complicated gas mixture containing, for example, dopant compounds, their concentration might not be taken into account due to their very little impact on the deposition rate of the whole process).

Figure 5B:
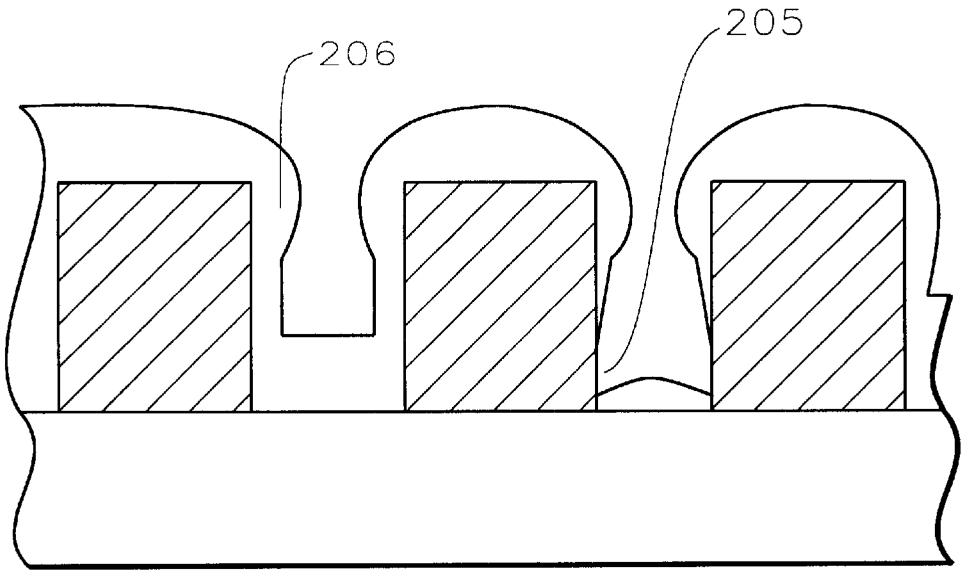
FIG. 5B Prior Art

Plasma Enhanced CVD (PECVD) using oxidation of silane or its derivatives with oxygen creates a specific "bread-loafing" profile of deposited film, as shown by 206 in FIG. 5B. This causes voids at spacings higher than about 0.6 micron and AR higher than about 0.6.

Figure 1:
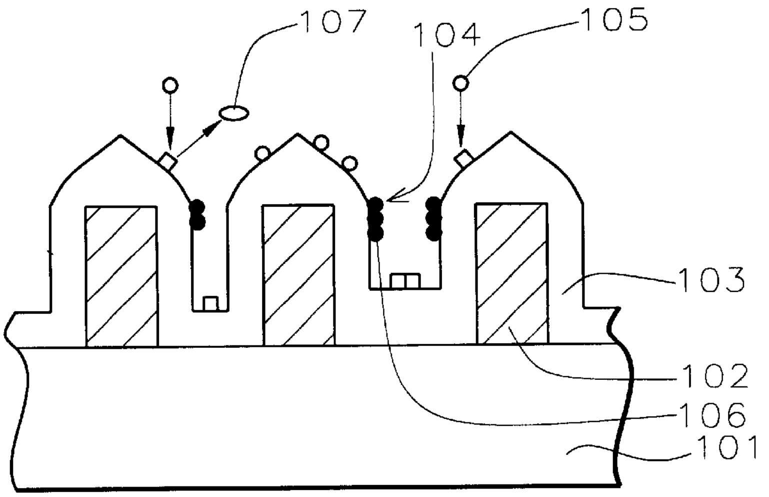
FIG. 1 Prior Art
FIG. 1 is a simplified cross-sectional scheme of a conventional HDP-CVD film deposition.

The HDP-CVD method with simultaneous deposition and in-situ etch/sputtering of the growing film allows an improvement of film growth, making it to be very specific, as shown in FIG. 1. In fact, growing HDP-CVD film 103 on the steps 102 of a device on the substrate surface 101 has a specific shape due to the partial sputtering of the growing silicon oxide species 104 by inert gas radicals 105. Sputtered species 104 can further either be re-deposited on the nearest surfaces the neighbor step to form re-deposited film 106, or evaporate 107 and further to be pumped out of the reactor. Eventually, simultaneous etch/sputtering allows improvement of the coating of growing film on the top of the structures and, therefore, an improvement of the HDP-CVD film gap-fill.

However, the HDP-CVD technique has also gap-fill limitations, as has been shown above. This is because the etch/sputtering cannot fully compensate for the strongly non-conformal profile of the growing film. As a result, voids 108 and 109 are forming during HDP-CVD film deposition, as shown in FIGS. 2A–2C. Thus, an improvement of the step coverage of the growing film itself and, therefore, during HDP-CVD film deposition, will lead to the improvement of HDP-CVD gap-fill capability without turning to major process parameters like etch to deposition ratio, pressure, power density, etc.

Invention's HDP-CVD with Additives Process

In summary: the advantages of a standard prior art HDP-CVD process cannot be used because of bad gap-fill capability with the tightening of device geometry and because of worsening of deposition rate with the decrease of process pressure and etch to deposition ratios. The invention's "HDP-CVD with additives" process covers the advantages of prior art methods and provides further advantages of film properties.

A. Advantages of the Invention 's HDP-CVD with Additives Process

The invention has the following advantages: good gap-fill capability at relatively high process pressures and etch to deposition ratios, relatively high deposition rate, and process productivity. Besides, it is simply realized and there is no need to change chamber design.

The invention's process can be performed in any High Density Plasma reactor provided with necessary wafer heating and equipped with necessary RF-power assemblies, gas supply system and vacuum pumping system without any modification of reaction chamber design. For instance, it can be realized in the "Ultima" HDP-CVD reactor made by Applied Materials, Inc., or in the "SPEED" HDP-CVD reactor created by Novellus's Inc., etc.

B. Application of Method of Invention's HDP-CVD with Additives Process

The Invention's HDP-CVD with additives process can be used to deposit the following types of dielectric layers: undoped silicon glass (USG), including liner and cap layers; borosilicate glass (BSG), phosphosilicate glass (PSG), borophosphosilicate glass (BPSG), and fluorosilicate glass (FSG).

C. Detailed Description of the Invention's HDP-CVD with Additives Process

This invention's HDP-CVD with additives process provides good gap-fill capability at relatively high process pressures and etch to deposition ratios and relatively high deposition rate and process productivity. Detailed parameters of the invention's HDP-CVD with additives process are shown in Table 1, shown above in the Summary section. The process parameters presented in Table 1 can be used for deposition of the silicon oxide that can be doped with boron, phosphorus and fluorine (the borosilicate, phosphosilicate, fluorosilicate and carbon-contained silicon glass films) using the Invention's HDP-CVD with additives deposition process with boron, phosphorus, and fluorinated silane derivatives, for example, such as diborane, phosphine, difluorosilane, tetrafluorosilane, etc. In this case, particular dopant precursor flows and ratios of boron, phosphorus, and fluorinated silane derivatives to silicon source flow are chosen based on the required concentration of boron, phosphorus, or fluorine in the glass. In the case of carbon-contained films, organic silane derivatives, such as methylsilanes, are used as a source of silicon.

The most critical parameters in the invention are additive to silicon source mole ratio, etch to deposition ratio, and process pressure. The following knowledge is used for an explanation of the possible reason for bad gap filling in prior art HDP-CVD processes. Also, the reason of proposed improvement can be understood clearly from the following explanation of film growth on the device steps, as shown schematically below. As it was shown in scheme (1) above, the general silane-based oxidation including HDP-CVD conditions can be expressed by the following simplified scheme of intermediate products (IMP) or radicals $R_n$* formation, where their concentration and their relative size is a function of particular process conditions. Further development of scheme (1) is presented below as a scheme (2). It represents a growth of silicon species as a function of relative chain size as follows:

(2)

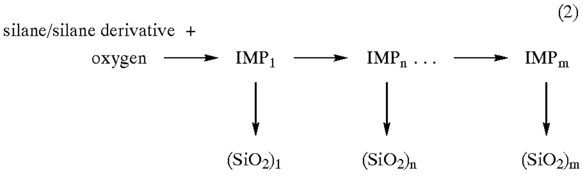

The complexity of the IMP is shown by a number (m>n>l) corresponding to the size of $SiO_2$ species which form in the gas phase. After that, silicon species diffuse toward the surface followed by film formation on the substrate surface. This chain reaction and, therefore, film growth is activated by reaction temperature, pressure, concentration of components in the gas phase, plasma activation, etc. To apply this reaction scheme to the film growth on the device structures with different spacing and aspect ratios, the following explanation is used. Higher IMP chains produce $SiO_2$ species with greater size (weight). Therefore, deeper chain development will lead to the formation of heavy species. It is clear that highest and, therefore, heaviest species will have a limitation for diffusion. This means that instead of diffusion into the narrow gap space, they will diffuse and react on the surfaces closest to the reaction which are, by definition, top surfaces of the device steps.

Figure 6A:
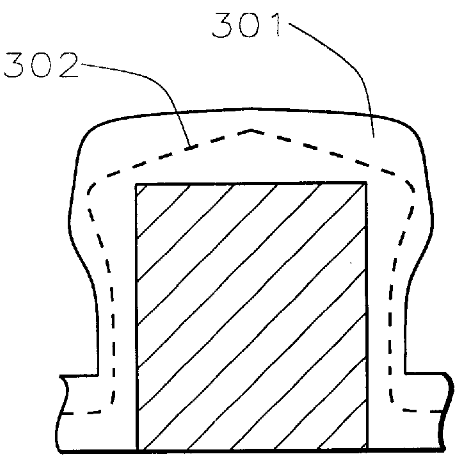
FIG. 6A Prior Art
FIGS. 6A and 6B are cross-sectional schemes illustrating non-conformal film growth on device steps during plasma-enhanced CVD from low-chained and highly-chained processes, respectively.
Figure 6B:
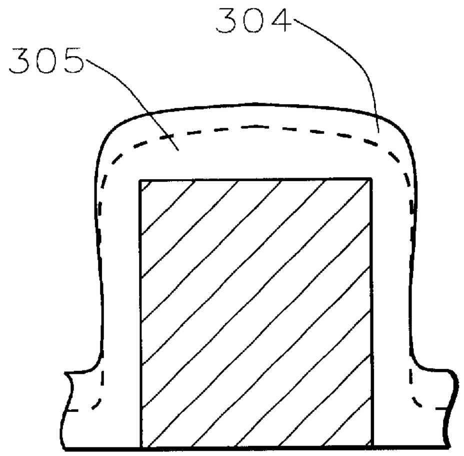
FIG. 6B Prior Art
Figure 7:
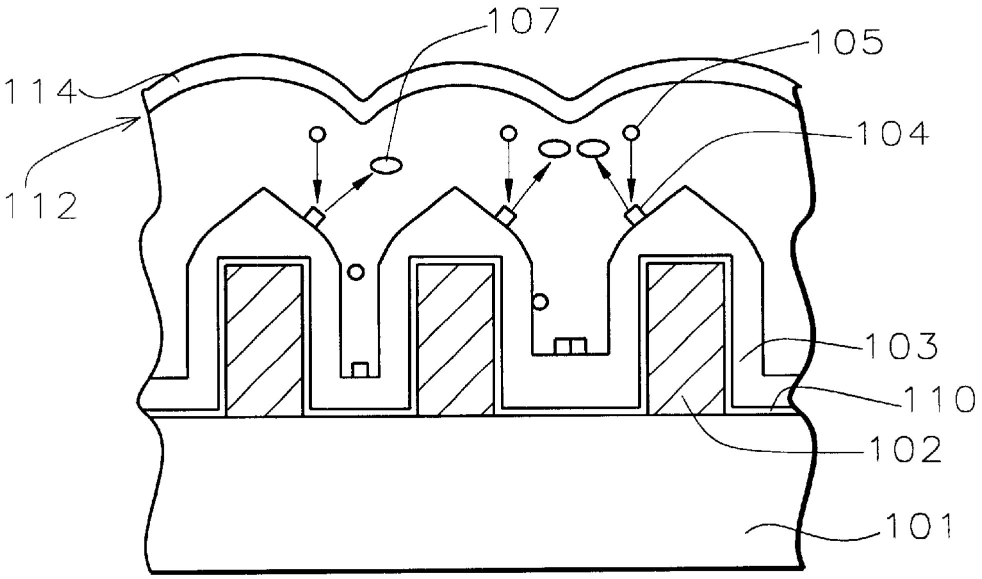
FIG. 7 is a simplified cross-sectional scheme of gap-fill capability improvement in accordance with present invention.

This means that the higher chain/radical reaction development will lead to worse film step coverage, as well as to the bread-loafing effect 301, as shown schematically in FIG. 6A. In contrast, the lower size (weight) of $SiO_2$ species in the gas phase will lead to the better step coverage 304, as shown in FIG. 6B. Further, during HDP-CVD film deposition with simultaneous etch/sputtering, these film step coverage profiles will lead to different shape formations 302 and 305, as shown schematically in FIGS. 6A, B. To improve undesirable bread-loaf shape 301 in FIG. 6A, an increase of etch to deposition ratio is normally used. However, this increase causes other problems such as increase of re-deposition effects, as was described above, and moreover, an increase of undesirable plasma induced damages on device characteristics. It is clear from this analysis, that a certain method allowing elimination of high chain development during deposition will help to improve film step coverage and, therefore, improve conditions to lower re-deposition effect. This is shown in FIG. 7 using the same definition as used in the prior art process scheme in FIG. 1. As a result, an improvement of deposition will lead to an improvement of gap-fill capability of the deposition process. Line 112 shows the completed gap-filling with no voids.

In this invention, in order to decrease undesirable chaining of intermediate products IMP (that really means the decrease of effective constant of deposition rate $K_{eff}$ and deposition rate itself), and in order to decrease an impact of highly-chained species into the non-conformal growth of film on the structure steps, an approach with special gas additives is proposed. These additives propose to fix chaining due to their reaction with intermediates/radicals in the gas phase. Eventually, it leads to the decrease of effective reaction constant and, therefore, to the decrease of undesirable gas phase processes leading to the strong non-conformal film growth. It also causes a certain decrease in the total deposition rate, which can be compensated easily by an adjustment of the other process parameters.

The following types of chemical compounds are proposed as additives for HDP-CVD deposition processes: a) halide-containing organic compounds with the general formula $C_xH_yR_z$ where R is fluorine or chlorine. In these compounds, x can range from 1 to 4, y can range from 0 to 8, and z can range from 8 to 0 in reverse order with respect to y. The most convenient compounds are fluorine/chlorine compounds such as $CF_4$, $CCl_4$ or $C_2F_6$, which are actively used in semiconductor manufacturing; b) chemical compounds with the double carbon-carbon bonds with general formula $C_nH_{2n}$, where n can be from 1 to 4. The most convenient are widely used chemicals, such as ethylene $C_2H_4$ or prophylene $C_3H_6$.

It is important to note that a concentration of additives is low enough to effect significantly film composition and properties. From the other side, addition of some fluorine or carbon to silicon dioxide films is now considered as helpful because of the decrease of dielectric constant values that means these additives cannot be considered as a harmful species for device applications. Finally, the summary of important parameters of the invention's HDP-CVD with additives process is presented in Table 3 below:

TABLE 3

| Parameter | Reason parameter is important |
|---|---|
| Additive to silicon source mole ratio | An increase of the ratio of additive to silicon source causes an increase of a concentration of additives which is necessary to suppress undesirable chaining in the gas-phase. It decreases the undesirable bread-loaf type of film deposition on the device steps, improves step coverage of growing film and, finally, improves gap-fill capability of the process. |
| Etch to deposition (E/D) ratio | The increase of E/D ratio leads to the increase of re-sputtering on device steps and, therefore, leads to worsening of step coverage on the top of step and, eventually, leads to worsening of gap-fill capability. |
| Pressure | Lowering of the pressure allows achieving better film step coverage on device steps and an improvement of film integrity on the steps. |

D. In-situ Liner/Cap Deposition Before/After in-situ HDP-CVD with Additives Silicon Oxide Film Deposition The invention also provides the following preferred embodiments where a liner layer is formed, and then without removing the substrate from the reactor, a silicon oxide layer is formed insitu thereover, both using the Invention's HDP-CVD with additives process The invention includes the following preferred structures/in-situ methods as shown in FIG. 7: a) oxide liner 110 and doped glass layer 103; b) doped glass layer 103 and oxide cap layer 114; and c) oxide liner 110 and doped glass layer 103 and oxide cap layer 114 on the top of doped glass layer 103.

E. Differentiation of the Invention Over the Prior Art HDP-CVD Processes

Table 4 below compares parameters for undoped silicon oxide of the invention's process with the prior art HDP-CVD process and clearly shows the difference between the invention and the prior art processes. Both processes use the same HDP-CVD reaction chamber type.

As Table 4 shows, the most important parameters for the invention are: ratio of additive to silicon source, etch to deposition ratio, and process pressure. It should be recognized that many publications describe the details of common techniques used in the fabrication process of integrated components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data is set forth based upon current technology. Future developments in the art may call for appropriate adjustments as would be obvious to one skilled in the art. Also, the conductive lines in the FIGS can represent any stepped structure on a semiconductor device and are not limited in composition.

TABLE 4

| | Invention's HDP-CVD with additives | | |
|---|---|---|---|
| Process parameter | Estimated range of parameters | Most preferred range of parameters | Prior art HDP-CVD |
| Wafer temperature (° C.) | 250–650 | 400–450 | 400–650 |
| Pressure (millitorr) | 0.5–10 | 1–5 | <5 |
| Plasma frequency (KHz) | 300–600 | 400–450 | 400–450 |
| Plasma density (ion/cm$^3$) | 1 × E11–1 × E13 | 1 × E11–1 × E12 | 1 × E12–1 × E13 |
| Etch to deposition ratio | 0.03–0.3 | 0.05–0.15 | 0.05–0.3 |
| Silicon source | Silane<br>Inorganic silane derivatives<br>Organis silane derivatives | Silane<br>Methylsilanes | Silane |
| Silicon source flow (sccm) | 50–500 | 100–200 | 100–200 |
| Oxygen flow rate (sccm) | 100–400 | 250–350 | 250–350 |
| Dopant compounds | Diborane and its derivatives<br>Phosphine and its derivatives<br>Fluorinated silane derivatives | Diborane and its derivatives<br>Phosphine and its derivatives<br>Fluorinated silane derivatives | Diborane and its derivatives<br>Phosphine and its derivatives<br>Fluorinated silane derivatives |
| Carrier gas | Ar, He | Ar, He | Ar, He |
| Carrier gas flow (sccm) | 20–400 | 50–100 | 50–100 |

TABLE 4-continued

| Process parameter | Invention's HDP-CVD with additives: Estimated range of parameters | Invention's HDP-CVD with additives: Most preferred range of parameters | Prior art HDP-CVD |
|---|---|---|---|
| Gas additives | 1) halides - containing organic compounds with general formula $C_xH_yR_z$*) 2) organic chemical compounds with the double carbon-carbon bonds with general formula $C_nH_{2n}$**) | 1) $CF_4$, $CHF_3$; $CCl_4$ or $C_2F_6$; 2) ethylene $C_2H_4$ or propylene $C_3H_6$ | NA |
| Additive/silicon source mole ratio: | | | |
| organic halides | 0.3–5 | 0.5–2.5 | NA |
| organic $C_nH_{2n}$ | 3–20 | 5–15 | NA |

While the invention has been particularly shown and described with reference to the preferred embodiments thereof, it will be understood by those skilled in the art that various changes in form and details may be made without departing from the spirit and scope of the invention.

What is claimed is:

1. A method of forming a silicon oxide film over a heated substrate by High Density Plasma Chemical Vapor Deposition (HDP-CVD) using a silicon source and an oxygen source as essential reactants in the constant presence of a plasma; the method comprising the steps of:

a) placing a substrate in a reactor chamber wherein said substrate has at an upper surface a plurality of steps; and b) in a deposition step, inducing a reaction in a gaseous mixture composition to produce deposition of a silicon oxide film over said substrate wherein said silicon oxide film is deposited by subjecting said substrate to a plasma during the entire said deposition step, and wherein said composition comprises said silicon source, said oxygen source, a carrier gas a source of dopant compounds and a gas additive comprising $CCl_4$ with an additive to silane mole ratio between 0.3 and 5 or chemical compounds with the double carbon-carbon bonds having the general formula $C_nH_{2n}$ with an additive to silane mole ratio between 3 and 20 and wherein the presence of said gas additive causes said silicon oxide film to have no voids in said film between said steps.

2. The method according to claim 1 wherein said reaction occurs under the following conditions: a temperature of said substrate is between about 250° C. and 650° C.; a process pressure is between 0.5 and 10 millitorr, frequency of energy in said reactor chamber to produce said plasma is between about 300 KHz and 600 KHz, said plasma has a plasma density in the range of between about 1×E11 and 1×E13 ion/cm$^3$, said silicon source is silane with a flow of between 50 and 500 sccm, said oxygen source has a flow rate of between 100 and 400 sccm, said carrier gas has a flow of between 20 and 400 sccm, and said gas additive comprises $CCl_4$, ethylene $C_2H_4$, or propylene $C_3H_6$.

3. The method according to claim 1 wherein said reaction occurs under the following conditions: a temperature of said substrate is between about 400° C. and 650° C., a process pressure is between 1 and 5 millitorr, a frequency of energy in said reactor chamber to produce said plasma is between about 400 KHz and 450 KHz, said plasma has a plasma density in the range of between about 1×E11 and 1×E12 ion/cm$^3$, said silicon source is silane with a flow of between 100 and 200 sccm, said oxygen source has a flow rate of between 250 and 350 sccm, said carrier gas has a flow of between 50 and 100 sccm, and said gas additive comprises one of the group consisting of $CHF_3$, and $CCl_4$ with an additive to silane mole ratio of between 0.5 and 2.5, and ethylene $C_2H_4$ and propylene $C_3H_6$ with an additive to silane mole ratio between 5 and 15.

4. The method according to claim 1 wherein said silicon source is an inorganic silane derivative.

5. The method according to claim 1 wherein said reaction occurs under the following conditions: a temperature of said substrate is between about 250° C. and 650° C.; a process pressure is between 0.5 and 10 millitorr, frequency of energy in said reactor chamber to produce said plasma is between about 300 KHz and 600 KHz, said plasma has a plasma density in the range of between about 1×E11 and 1×E13 ion/cm$^3$, said silicon source is an inorganic silane derivatives with a flow of between 50 and 500 sccm, said oxygen source has a flow rate of between 100 and 400 sccm, said carrier gas has a flow of between 20 and 400 sccm, and said gas additive comprises $CCl_4$, ethylene $C_2H_4$, or propylene $C_3H_6$.

6. The method according to claim 1 wherein said silicon source is an organic silane derivative.

7. The method according to claim 1 wherein said reaction occurs under the following conditions: a temperature of said substrate is between about 250° C. and 650° C.; a process pressure is between 0.5 and 10 millitorr, frequency of energy in said reactor chamber to produce said plasma is between about 300 KHz and 600 KHz, said plasma has a plasma density in the range of between about 1×E11 and 1×E13 ion/cm$^3$, said silicon source is an organic silane derivatives with a flow of between 50 and 500 sccm, said oxygen source has a flow rate of between 100 and 400 sccm, said carrier gas has a flow of between 20 and 400 sccm, and said gas additive comprises $CCl_4$, ethylene $C_2H_4$, or propylene $C_3H_6$.

8. The method according to claim 1 wherein said composition further comprises a source of boron and said silicon oxide film is doped with said boron.

9. The method according to claim 1 wherein said composition further comprises a source of phosphorus and said silicon oxide film is doped with said phosphorus.

10. The method according to claim 1 wherein said composition further comprises a source of boron and a source of phosphorus and said silicon oxide film is doped with said boron and said phosphorus.

11. The method according to claim 1 wherein said composition further comprises a source of fluorine and said silicon oxide film is doped with said fluorine.

12. A method of forming a silicon oxide film over a heated substrate by High Density Plasma Chemical Vapor Deposition (HDP-CVD) using a silicon source and an oxygen source as essential reactants in the constant presence of a plasma; the method comprising the steps of:

a) placing a substrate in a reactor chamber wherein said substrate has at an upper surface a plurality of steps; and b) in a deposition step, inducing a reaction in a gaseous mixture composition to produce deposition of a silicon oxide film over said substrate wherein said silicon oxide film is deposited by subjecting said substrate to a plasma during the entire said deposition step, and wherein said composition comprises said silicon source, said oxygen source, a carrier gas, a source of boron, a source of phosphorus, a source of fluorine, and a gas additive comprising $CCl_4$ with an additive to silane mole ratio between 0.3 and 5 or chemical compounds with the double carbon-carbon bonds having the general formula $C_nH_{2n}$ with an additive to silane mole ratio between 3 and 20 and wherein said silicon oxide film has no voids in said film between said steps.

13. The method according to claim 12 wherein said reaction occurs under the following conditions: a temperature of said substrate is between about 250° C. and 650° C.; a process pressure is between 0.5 and 10 millitorr, frequency of energy in said reactor chamber to produce said plasma is between about 300 KHz and 600 KHz, said plasma has a plasma density in the range of between about 1×E11 and 1×E13 ion/$cm^3$, said silicon source is silane with a flow of between 50 and 500 sccm, said oxygen source has a flow rate of between 100 and 400 sccm, said carrier gas has a flow of between 20 and 400 sccm, said sources of boron and phosphorus are diborane and phosphine or their derivatives, said source of fluorine is a fluorinated derivative of silane, and said gas additive comprises $CCl_4$, ethylene $C_2H_4$, or propylene $C_3H_6$.

14. The method according to claim 12 wherein said reaction occurs under the following conditions: a temperature of said substrate is between about 400° C. and 650° C., a process pressure is between 1 and 5 millitorr, a frequency of energy in said reactor chamber to produce said plasma is between about 400 KHz and 450 KHz, said plasma has a plasma density in the range of between about 1×E11 and 1×E12 ion/$cm^3$, said silicon source is silane with a flow of between 100 and 200 sccm, said oxygen source has a flow rate of between 250 and 350 sccm, said carrier gas has a flow of between 50 and 100 sccm, said sources of boron and phosphorus are diborane and phosphine or their derivatives, said source of fluorine is a fluorinated derivative of silane, and said gas additive comprises one of the group consisting of $CHF_3$, and $CCl_4$, with an additive to silane mole ratio of between 0.5 and 2.5, and ethylene $C_2H_4$ and propylene $C_3H_6$ with an additive to silane mole ratio between 5 and 15.

15. The method according to claim 12 wherein prior to said deposition step to form said silicon oxide film, further comprising performing in-situ an oxide liner step to form an oxide liner over said substrate.

16. The method according to claim 12 wherein after said deposition step to form said silicon oxide film, performing in-situ an oxide layer step to form an oxide cap layer over said silicon oxide film.

17. A method of forming a silicon oxide film over a heated substrate by High Density Plasma Chemical Vapor Deposition (HDP-CVD) using a silicon source and an oxygen source as essential reactants in the constant presence of a plasma; the method comprising the steps of:

a) placing a substrate in a reactor chamber wherein said substrate has at an upper surface a plurality of steps;

b) in an oxide liner step, forming an oxide liner over said substrate;

c) in a deposition step, inducing a reaction in a gaseous mixture composition to produce deposition of a silicon oxide film over said substrate wherein said silicon oxide film is deposited by subjecting said substrate to a plasma during the entire said deposition step, and wherein said composition comprises said silicon source, said oxygen source, a carrier gas, a source of boron, a source of phosphorus, a source of fluorine, and a gas additive comprising $CCl_4$ with an additive to silane mole ratio between 0.3 and 5 or ethylene $C_2H_4$ or propylene $C_3H_6$ with an additive to silane mole ratio between 3 and 20 and wherein said silicon oxide film has no voids in said film between said steps; and d) in an oxide cap layer step, forming an oxide cap over said silicon oxide film.

18. The method according to claim 17 wherein said reaction occurs under the following conditions: a temperature of said substrate is between about 250° C. and 650° C.; a process pressure is between 0.5 and 10 millitorr, frequency of energy in said reactor chamber to produce said plasma is between about 300 KHz and 600 KHz, said plasma has a plasma density in the range of between about 1×E11 and 1×E13 ion/$cm^3$, said silicon source is silane with a flow of between 50 and 500 sccm, said oxygen source has a flow rate of between 100 and 400 sccm, said carrier gas has a flow of between 20 and 400 sccm, said sources of boron and phosphorus are diborane and phosphine or their derivatives, said source of fluorine is a fluorinated derivative of silane.

19. The method according to claim 17 wherein said reaction occurs under the following conditions: a temperature of said substrate is between about 400° C. and 650° C., a process pressure is between 1 and 5 millitorr, a frequency of energy in said reactor chamber to produce said plasma is between about 400 KHz and 450 KHz, said plasma has a plasma density in the range of between about 1×E11 and 1×E12 ion/$cm^3$, said silicon source is silane with a flow of between 100 and 200 sccm, said oxygen source has a flow rate of between 250 and 350 sccm, said carrier gas has a flow of between 50 and 100 sccm, said sources of boron and phosphorus are diborane and phosphine or their derivatives, said source of fluorine is a fluorinated derivative of silane, and said gas additive comprises one of the group consisting of $CHF_3$ and $CCl_4$ with an additive to silane mole ratio of between 0.5 and 2.5, and ethylene $C_2H_4$ and propylene $C_3H_6$ with an additive to silane mole ratio between 5 and 15.

* * * * *